United States Patent [19]

More et al.

[11] Patent Number: 4,891,734
[45] Date of Patent: Jan. 2, 1990

[54] VIBRATION MOUNT FOR ELECTRONIC ASSEMBLIES

[75] Inventors: Henry S. More, Los Altos; John L. Marsh, Cupertino, both of Calif.

[73] Assignee: Quantum Solutions, Inc., Santa Clara, Calif.

[21] Appl. No.: 206,837

[22] Filed: Jun. 15, 1988

[51] Int. Cl.⁴ .......................... H05K 5/06; H05K 7/20
[52] U.S. Cl. ............................ 361/417; 174/52.2; 357/72; 264/272.11
[58] Field of Search ............. 361/417, 399, 398, 397, 361/399; 174/52.2; 264/272.11, 272.13, 272.15; 357/72

[56] References Cited

U.S. PATENT DOCUMENTS

| | | | |
|---|---|---|---|
| 3,426,139 | 2/1969 | Lauliac | 174/52.2 X |
| 3,670,091 | 6/1972 | Frantz et al. | 174/52.2 |
| 3,909,504 | 9/1975 | Browne | 174/52.2 |
| 4,001,655 | 1/1977 | Voyles et al. | 174/52.2 X |
| 4,042,955 | 8/1977 | Imai et al. | 357/72 |
| 4,739,449 | 4/1988 | Kaufman | 361/388 |

Primary Examiner—A. D. Pellinen
Assistant Examiner—David Osborn
Attorney, Agent, or Firm—John D. Jeter

[57] ABSTRACT

An elastomeric body encapsulates an electronic assembly, to be protected from vibration on shock, and is confined in a closed cavity of a structure subject to the vibration and shock. The body is cast in a separate mold having a cavity corresponding in shape and size to the closed cavity. The surface of the mold has projections to form indentations in the surface of the body. With the body in the closed cavities, the indentations are effectively voids and accept elastomeric material displaced from the body when the body expands relative to the cavity.

The preferred embodiment provides a strongback support with open cavities, each to receive a body. The strongback is inserted into a tube to complete the structure and close the open cavities. The strongback has wiring chambers to accept flexible leads connected to each body, and channels into which wire is potted, to extend from the leads to external circuitry.

To retain the bodies in the open cavities before closing, the elastomer bodies have projections that resiliently engage cooperation surfaces in the cavities.

12 Claims, 2 Drawing Sheets

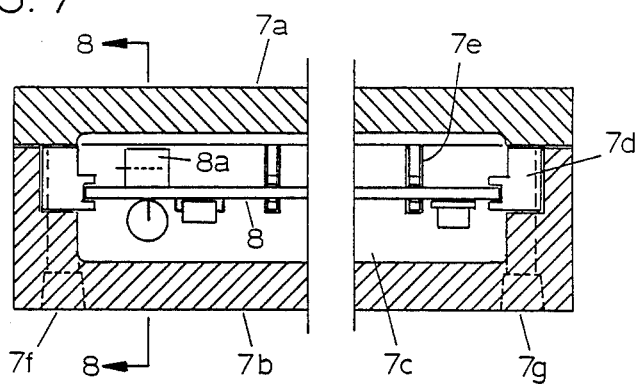
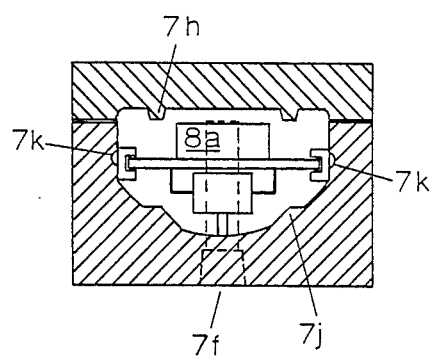
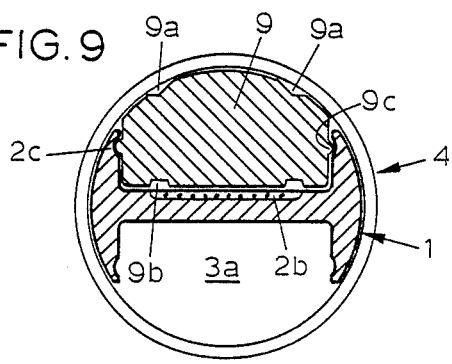
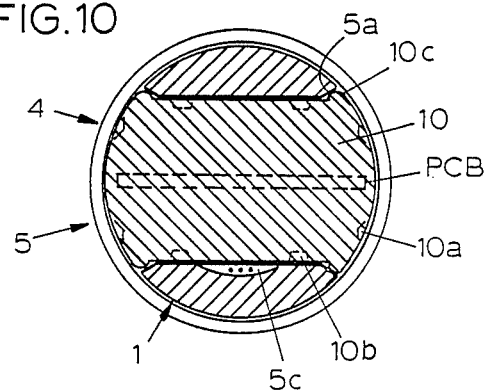
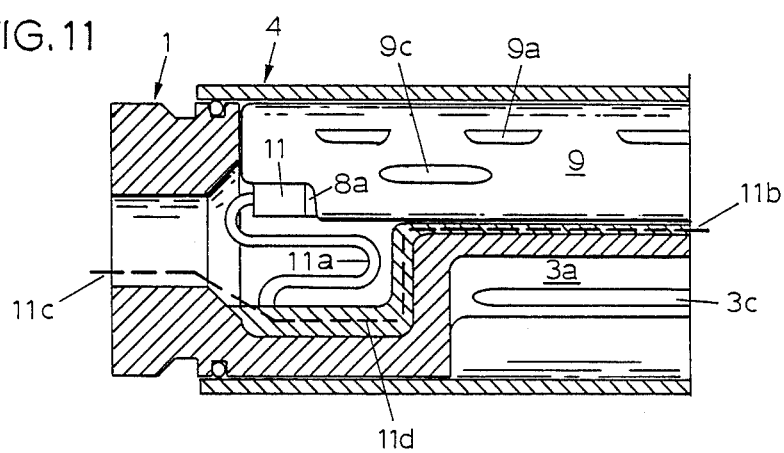

VIBRATION MOUNT FOR ELECTRONIC ASSEMBLIES

This invention pertains to the construction and mounting of electronic components and assemblies for use in vibration and shock environments. Particular features relate to use in down hole applications in drill strings in wells.

Use of ruggedized electronic components down hole in well drilling activities has been possible only in recent years. Shock and vibration are commonly present in the drill string axial direction, along both transverse axes, and rotational acceleration about the axis. The electronic assembly survives long hours down hole only if the mounting support offers protection from acceleration induced forces that cause relative strain between components. Failures result too often and have serious economic consequence.

Two mounting options now dominate known art. Both options involve the use of supporting printed circuit boards on structures called strongbacks suspended in confining, pressure proof, enclosures. The pressure proof enclosures are necessarily attached to the drill string. A drill bit attached to the drill string is the origin of the most serious shock and vibration. The resulting acceleration forces are transmitted by way of the drill string to the enclosure and the attached strongback to the electronic assembly and components. Acceleration forces cause relative motion between printed circuit boards (PCB) and attached components and failures result.

The two currently used mounting options include; (1) attachment of the PCB to the strongback with screws, with a sheet of elastomer captured between PCB and strongback and, (2) positioning the PCB in openings, or cavities, in the strongback and largely filling the remaining volume with elastomer cast and cured in place. In both cases, the strongback, with the electronic assembly in place, is inserted in the bore of a confining structure, usually a tubular pressure barrel.

The first mounting option causes stress concentrations at the screws where acceleration forces are transmitted from the strongback to the PCB. Additionally, temperature changes cause relative thermal expansion between PCB and strongback and strains the screw attachment points.

The second mounting option provides cushioning for all components, for acceleration forces delivered through the strongback. Differential thermal expansion between elastomer and strongback, however, causes forced migration of elastomer in unpredictable amounts and directions. Destructive strains force relative movement between PCB and attached components.

The ideal support for electronic components will cushion all components about equally and will allow inevitable elastomer migration, very localized, in known directions and in known amounts. Additionally, the small movements allowed by cushioning will be accomodated by free moving conductors sufficiently short and supported to prevent their becoming a vibrating independent mass.

It is therefore an object of this invention to provide mounting support for the individual components in electronic assemblies such that acceleration forces are not transferred between components and the component attachment points.

It is another object of this invention to provide an elastomeric body to encapsulate electronic components and related assemblies and to extend to structural supports and to provide voids into which elastomer can migrate in a planned manner.

It is another object of this invention to provide methods for encapsulation of electronic assemblies in separate molds shaped to represent cavities in structures destined to receive the encapsulating elastomer body.

It is another object of this invention to provide resilient projections on encapsulating bodies to engage indentations in the receiving structure such that the bodies can be pushed into the receiving structure and be retained in place during sub-assembly handling.

It is yet another object of this invention to provide connectors imbedded in the elastomer bodies and exposed to receive connecting terminals with some free motion in connecting wiring.

It is still another object of this invention to provide confining structural enclosures for encapsulated electronic assemblies from which the assemblies can readily be removed for maintenance and repair.

It is yet a further object of this invention to provide encapsulating bodies over conformal coating that does not adhere to the elastomer of the body for easy peeling of elastomer for repair.

These and other objects, advantages, and features of this invention will be apparent to those skilled in the art from a consideration of this specification, including the attached claims and appended drawings.

SUMMARY OF THE INVENTION

An electronic assembly is enclosed in an elastomeric body separately molded to fit a confining enclosure comprising a strongback, with cavities for the body, and a tubular shroud to receive the strongback with contained body. The preferred cavities either open laterally from the side of the strongback or extend transversely through it.

The electronic assembly is positioned in a mold shaped to represent the cavity destined to receive it and elastomeric material is cast around the assembly. Only a connector is exposed at the elastomer surface.

The molds have surface projections to create indentures in the molded elastomer into which the finally confined elastomer can migrate when differential thermal expansion causes such migration. By strategic placement of the indentures, which behave as voids in the enclosed material, elastomer displacement is highly localized and causes little strain on imbedded components.

The molds have indentations which produce projections on the molded body. The strongback cavities have indentures to match the projections. The projections, being elastic, deform to allow the body to be pushed into the receiving cavity yet retain the body in place during handling as a subassembly, before the body is finally enclosed within the tubular shroud.

The electronic assembly has connectors, preferably attached to a printed circuit board (PCB) and the entirety is encapsulated within the body with only the connector electrodes exposed. The entirety is positioned within the mold, by locator inserts, the entirety is encapsulated in elastomer and, when removed, the locator inserts are discarded, and any excess alastomer is trimmed to expose the connector.

To facilitate maintenance rework, the electronic assembly is, optionally, coated with a conformal coating to which the elastomer will not adhere. The elastomer, then, can be cut and peeled away from the components for replacement.

The elastomer is supported, in the final assembly, by the confining structure and all electronic components are about equally cushioned from acceleration loads. The cushioning effect allows some relative motion between elastomer body and the strongback. Interconnecting wiring is attached to and partly potted into grooves and recesses in the strongback. Each encapsulated assembly is connected to the wiring by mating halves of connectors secured to the connectors imbedded in the body. A short length of the connecting wire is free to move relative to both body and strongback.

A plurality of elastomer bodies, with enclosed electronic assemblies, are commonly mounted on one strongback. Three such bodies, with interconnecting wiring bonded to the strongback are disclosed. A single body, or any number of bodies, may be similarly arranged. Two bodies are preferably mounted back-to-back in oppositely opening cavities, are electrically interconnected to one body situated in a generally central transverse cavity, and represents a typical arrangement.

BRIEF DESCRIPTION OF DRAWINGS

In the drawings wherein like features have like captions.

FIG. 7 is a side elevation, in cutaway, of a mold used to process parts used in the disclosed shock mount.

FIG. 8 is a sectional view taken along line 8—8 of FIG. 7.

FIG. 9 is a sectional view, similar to FIG. 3, with selected assembly completed.

FIG. 10 is a sectional view, similar to FIG. 6 with selected assembly completed.

FIG. 11 is a side elevation, partly cut away, similar to the left end of FIG. 1, with selected assembly completed.

DETAILED DESCRIPTION OF DRAWINGS

Figure 1:
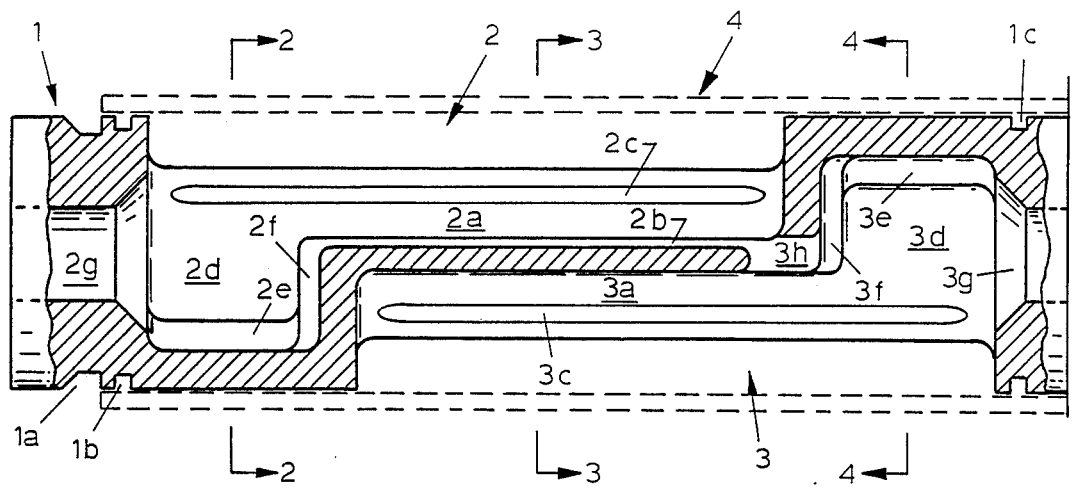
FIG. 1 is a side elevation, in cutaway, of one end of the preferred enclosing structure.

FIG. 1 represents typical preferred configuration of the structure that houses and supports electronic assemblies for use in drill strings in wells. By way of description, strongback 1 is machined from a cylindrical bar. Open cavities 2 and 3 in the strongback open laterally outward and become closed cavities when the strongback is inserted into the bore of tube 4. Peripheral groove 1a is an attachment means that secures the strongback to structure attached to the drill string. O-rings in grooves 1b and 1c seal the bore and reduce "chattering" between strongback and tube in the presence of vibration and shock. The assembly of FIG. 1 is inserted into a pressure proof housing (not shown) which is suspended in the drill string bore for downhole use.

Hole 2g, recesses 2e, 2f and 2b, relief 3h, recesses 3f and 3e, and hole 3g represent channels by which electrical wiring may extend from the left end to, and through, the right end of the length of strongback shown. Such wiring is commonly potted into the channels, with the wires associated with connector halves for adjacent electronic assemblies on short free lengths emerging from the potting. When the connector halves are connected to the assemblies to be inserted into the cavities, the flexible leads will fold into recesses 2d and 3d. One cavity only may exist in a strongback but two are shown, almost identical but inverted and axially reversed relative to each other. This makes maximum use of available space.

Figure 2:
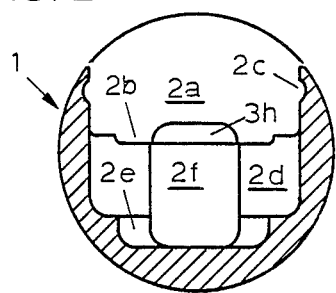
FIG. 2 is a sectional view taken along line 2—2 of FIG. 1.
Figure 3:
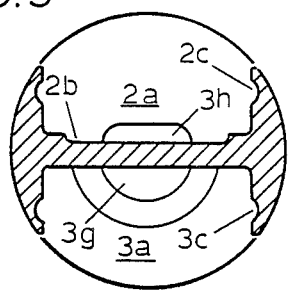
FIG. 3 is a sectional view taken along line 3—3 of FIG. 1.
Figure 4:
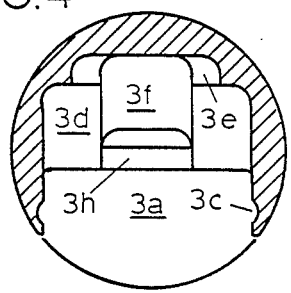
FIG. 4 is a sectional view taken along line 4—4 of FIG. 1.

Axial grooves 2c and 3c are referred to as indentations in the wall of the cavities. FIGS. 2, 3 and 4 show the sectional shape of the indentations.

Recesses 2b, 2e and 3e will be filled with potting compound after wire installation. Recesses 2d and 3d are the same width as cavities 2a and 3a. Cavity 3a is the approximate shape of the section of the elastomeric body (shown later) that will be inserted into each cavity.

While considering FIG. 1, with tube 4 closing the cavities, and an elastomeric body essentially filling cavity 2a, the effect of expansion of elastomer relative to the cavity can be appreciated. Elastomer would be forced to migrate toward unfilled space and would entrain the components supposedly protected, or possibly crush any containing voids.

Figure 5:
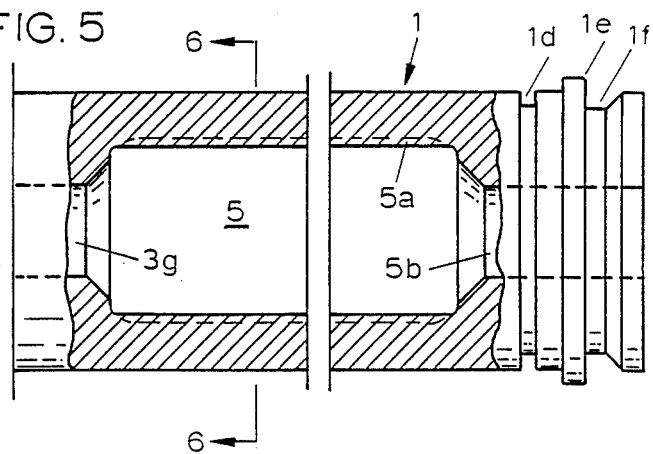
FIG. 5 is a side elevation, mostly cut away, is a continuation of the structure of FIG. 1, with an alternate cavity configuration.
Figure 6:
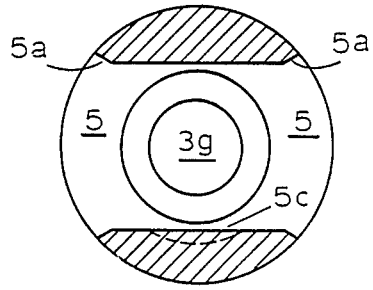
FIG. 6 is a sectional view taken along line 6—6 of FIG. 5.

FIG. 5 shows an optional extension of the strongback of FIG. 1, with one transverse open cavity 5 extending through the general center. Cavity 5 is closed when tube 4 (not shown) is installed around the strongback. Flange 1e axially locates tube 4 and O-ring groove 1d seals the tube bore. Peripheral groove 1f is optional and is used only if an additional device is attached to that shown. Hole 5b is used only if an additional device is attached that needs wiring. Hole 3g is a continuation of hole 3g of FIG. 1. Cavity 5 will accomodate a wider electronic assembly than will cavities 2 and 3. Optional wiring recess 5c is present if hole 5b is used and is potted to the plane surface of cavity 5. Surfaces 5a serve the same purpose as indentations 2c and 3c and becomes an indentation in conjunction with installed tube 4.

Note that an elastomeric body filling cavity 5, when closed, and subject to expansion relative to the cavity, will force material toward hole 3g (and hole 5b is present). Features presented later will avoid that problem.

FIG. 7 represents a mold having a top 7a fitted on a bottom 7b to provide mold cavity 7c therein. A printed circuit board (PCB) 8, with electronic components and a connector half 8a attached, is positioned within the mold cavity by hangers 7d which are captured in mold slots 7e. Eight such hangers are usually provided. Sprue hole 7g is used to inject potting compound into the cavity. Vent hole 7f is used to evacuate air to avoid bubble inclusion in the product. Potting compound fully fills the cavity and is allowed to cure at least enough to retain its shape when removed from the mold. Optionally, a heat cycle applied after the cast elastomeric body is removed from the mold completes curing of elastomer.

The mold cavity shown has the general shape of closed cavity 2 or 3 of FIG. 1. The cross section of the elastomeric body is best shown as 9 of FIG. 9. Surface contour of the mold cavity 7a includes projections 7h and 7j which produce indentations 9a and 9b in body 9, best shown in FIG. 9.

The mold cavity has indentations 7k which produce projections 9c on the body. There are commonly six such projections per body.

When the elastomeric body is sufficiently cured, top 7a is removed and a thin cutter is used to sever the material connecting body and sprue in holes 7f and 7g. The body is lifted out, and the hangers are pulled out. Any excess elastomer material is trimmed to expose the end and connectors of the connector half 8a. Projections 9c are sufficiently resilient to deform for removal of body from mold. Indentations 9a and 9b are long grooves on some bodies but are short distributed indentations on other bodies.

Before assembly 8 is placed in the mold, all mold cavity surfaces are sprayed with mold release agent.

Before assembly 8 is placed in the mold, a conformal coating is optionally applied to all components and PCB except for the connector half electrodes. Preferably, the conformal coating is a selection that will not adhere to the elastomeric material of the body. That permits peeling of elastomer for replacement of components later found unsuitable.

In FIG. 9, elastomeric body 9, formed in mold cavity 7a, is shown positioned in cavity 2a. No encapsulated electronics is shown for clarity of body and cavity relationship. The open cavity 2a in strongback 1 is being closed by installation of tube 4, seen as an end view. Projections 9c, being resilient, allowed body 9 to be pushed radially into the open cavity and, when insertion is complete, will engage indentations 2c as shown. This holds the body in the cavity for normal handling before the cavity is closed. Temperature changes common to down hole application will cause body 9 to expand relative to the closed cavity. The elastomer of body 9 will migrate locally into available indentations 9a and 9b and will not destructively entrain electronic components. Wires are shown potted into recess 2b.

In FIG. 10, a transverse open cavity 5 in strongback 1 has elastomeric body 10 installed and the cavity is being closed by tube 4 being installed. An end view of tube 4 is visible.

Elastomeric body 10 is formed in the manner described for body 9, in a mold cavity differing in shape. The procedure is unchanged. Cavity 5 accomodates a wider PCB and electronic components are commonly installed on both sides. Like assembly 8, a connector half is fastened to one side of the PCB. Once the body is removed from the mold, the elastomer is trimmed to expose the connector half electrodes. Projections 10c are in different locations compared with FIG. 9 but the forming and function is much the same. Projections 10c engage bevels 5a to retain body 10 in place until the cavity is closed. Bevels 5a are referred to as indentations. Wires are shown potted into recess 5c.

In FIG. 11, the left end of the structure of FIG. 1 is shown with body 9 in place in cavity 2a. Connector half 8a has been exposed by trimming away elastomer. Before body 9 was placed in the cavity, connector half 11 was pulled up on flexible lead 11a, connected to connector half 8a, and the body was pushed radially into the cavity while leads 11a folded into recess 2d. The body is not sectioned and recesses 9a are visible. Projection 9a is one of six on the body.

Interconnecting wires 11c extend through hole 2g, are potted into recesses 2e, 2r and 2b to continue as wires 11b. Wires 11c and 11b are typical and may transit the structure shown to serve equipment farther right, or go to connector half 11, or do both. Cavity 3a is shown vacant.

Body 10 in recess 5 has no wire clearance recess such as 2d for wires such as 11a. Referring back now to FIG. 5, when body 10 is to be inserted into cavity 5, a connector half much like 11 is attached and the flexible wire attached is pushed back into hole 3g.

Potting material for use as defined herein includes, but is not limited to, the family of materials including the material known as Dow Corning "Sylgard" and "Silastic" J RTV Silicone Rubber.

Conformal coating material for use as defined herein includes, but is not limited to, the family of materials including the material known as Dow Corning type 1-2577.

From the foregoing, it will be seen that this invention is one well adapted to attain all of the ends and objects hereinabove set forth, together with other advantages which are obvious and which are inherent to the method and apparatus.

It will be understood that certain features and subcombinations are of utility and may be employed without reference to other features and subcombinations. This is contemplated by and is within the scope of the claims.

As many possible embodiments may be made of the apparatus and method of this invention without departing from the scope thereof, it is to be understood that all matter herein set forth or shown in the accompanying drawings is to be interpreted as illustrative and not in a limiting sense.

The invention having been described, we claim:

1. A mounting with enclosed electronic components for supporting the components when the mounting is situated in closed cavities in structure subject to the acceleration forces caused by vibration and shock, the mounting comprising:
   (a) a housing, having an opening;
   (b) a strongback, arranged to be supported in said opening, having at least one open cavity opening from said strongback, said open cavity arranged to be closed by cooperating structure to form the closed cavity;
   (c) a separately molded elastomeric body, enclosing the electronic components, shaped to generally fit and approximately fill said closed cavity in said cavity;
   an improvement comprising,
   (d) indentations in the surface of said body arranged to receive elastomeric material from said body when said body expands relative to said closed cavity.

2. The mounting of claim 1 wherein said elastomeric body contains at least one electric connector half first embedded therein, with electrodes later exposed by removal of some of said elastomer to accept a mating connector half.

3. The mounting of claim 1 wherein said strongback has a centerline, with two said open cavities opening radially outward on opposite sides of said centerline.

4. The mounting of claim 1 wherein said strongback has a centerline, with at least one of said cavities extending transversely through the general center of said strongback.

5. The mounting of claim 1 wherein said strongback has a centerline, with at least one of said open cavities opening radially therefrom and at least one of said open cavities extending transversely through the general center of said strongback.

6. The mounting of claim 1 wherein at least one of said open cavities opens from said strongback, said strongback having at least one connector half extending into said cavity on flexible wiring leads secured to said strongback.

7. The mounting of claim 6 wherein said flexible wiring leads interconnect with electric wiring potted into a channel in said strongback.

8. The mounting of claim 1 wherein at least one wiring chamber is situated in said strongback, in communication with said open cavity, and a channel for electric wiring extends from said chamber to open from said strongback for wiring to external circuitry.

9. The mounting of claim 1 wherein said housing is a tube and said strongback is shaped to be inserted into the bore of said tube, said strongback having an entry channel to accept electric wiring leading from external circuitry to said closed cavity.

10. The mounting of claim 9 wherein said strongback has ends arranged to close the bore of said housing when situated therein, said entry channel opening from at least one of said ends.

11. The mounting of claim 1 wherein a plurality of elastomeric projections are provided on the surface of said body, arranged to engage cooperating surfaces on the surface of said open cavity to resist movement of said body from said open cavity.

12. The mounting of claim 1 wherein said elastomeric body comprises material from at least one of the families of materials including the materials known as Dimethyl silicone and Methyl phenyl silicone rubber.

* * * * *